United States Patent [19]

Mizuno et al.

[11] 4,101,324

[45] Jul. 18, 1978

[54] PRINTING PLATE AND METHOD FOR FORMING THE SAME HAVING SMALL PROJECTIONS IN NON-IMAGE AREAS

[75] Inventors: Masayoshi Mizuno; Tadashi Kawamoto; Kiichi Iida, all of Shizuoka, Japan

[73] Assignee: Asahi Kasei Kogyo Kabushiki Kaisha, Osaka, Japan

[21] Appl. No.: 742,477

[22] Filed: Nov. 17, 1976

Related U.S. Application Data

[62] Division of Ser. No. 617,131, Sep. 26, 1975, Pat. No. 4,046,071.

[30] Foreign Application Priority Data

Sep. 26, 1974 [JP] Japan .................................. 49-110001
Mar. 31, 1975 [JP] Japan .................................. 50-37775
Apr. 28, 1975 [JP] Japan .................................. 50-50775
May 22, 1975 [JP] Japan .................................. 50-60167

[51] Int. Cl.$^2$ ............................................. G03C 1/68
[52] U.S. Cl. ................................. 96/36.3; 96/35.1; 96/36.2; 96/38
[58] Field of Search ............... 96/36.3, 35.1, 36–36.2, 96/38, 45.2

[56] References Cited

U.S. PATENT DOCUMENTS 3,663,222  5/1972  Akamatsu et al. ..................... 96/35.1

FOREIGN PATENT DOCUMENTS 1,414,556  11/1975  United Kingdom.

*Primary Examiner*—John D. Welsh
*Attorney, Agent, or Firm*—Sughrue, Rothwell, Mion, Zinn and Macpeak

[57] ABSTRACT

A printing plate comprising a support, reliefs formed thereon as an image area, and from about 20 to about 4,000/cm$^2$ small projections thereon in non-image areas, the height of the reliefs being at least 0.05 mm larger than that of the small projections, and a method for making a printing plate which comprises:
(a) superimposing a photosensitive resin layer having a thickness of at least 0.06 mm on a support, which is at least semi-transparent to actinic light, in intimate contact therewith;
(b) exposing the resulting assembly to actinic light through an image-bearing transparency from the side of the photosensitive resin layer;
(c) exposing the assembly to actinic light through a dot-image-bearing transparency having a transparent halftone dot area in a proportion of 1 to 40% from the side of the support to thereby form reliefs on the support, as image areas, and a number of small projections having a height of at least 0.01 mm and being lower than the height of reliefs, in non-image areas, wherein steps (b) and (c) may be conducted in the order: (b) and then (c); or (c) and then (b); or simultaneously.

9 Claims, 2 Drawing Figures

PRINTING PLATE AND METHOD FOR FORMING THE SAME HAVING SMALL PROJECTIONS IN NON-IMAGE AREAS

This is a division of application Ser. No. 617,131 filed Sept. 26, 1975, now U.S. Pat. No. 4,046,071.

BACKGROUND OF THE INVENTION

1. FIELD OF THE INVENTION

This invention relates to a novel relief printing plate, and a method for making the same. More specifically, this invention relates to a relief printing plate in which staining of non-image areas during printing (usually called "bottoming") is prevented as a result of providing small projections in these areas, and to a method for making the same.

2. DESCRIPTION OF THE PRIOR ART

Various methods are in use for making relief printing plates, such as the cast molding of type metal, the etching of a metal plate, or the use of a photopolymer. In all such methods, reliefs which form image areas are required to have considerable height. If reliefs are low in height, in relief printing ink cannot be prevented from adhering to non-image areas and causes bottoming. In order to prevent bottoming, the reliefs are usually required to have a height of at least 0.5 mm.

When printing is carried out using a plate having such a relatively high relief, especially on a rotary press, the printing plate must be mounted in cylindrical form on a plate cylinder. Hence, plates having such high reliefs (that is, thick plates) are inconvenient. For ease of mounting on a rotary press, flexible printing plates are also used. However, in order to mount a printing plate on a plate cylinder, it is preferred that the plate have as small a thickness as possible. Thinner plates also have the advantage of lower costs of production. Furthermore, etching of a metal plate to provide low reliefs can be completed within short periods of time without problems such as side etching, and the etching process can be simplified. In the preparation of a relief printing plate using a photopolymer, on the other hand, that part of the photopolymer layer which corresponds to the relief and which has a thickness corresponding to the height of the relief must be photocured, as described in U.S. Pat. No. 2,760,863 (British Pat. No. 741,441, etc.). Accordingly, when the height of the relief is low, the thickness of the photopolymer layer is small, and therefore, exposure time can be shortened.

Methods for printing with a plate having a relief height as low as about 0.1 to 0.3 mm, known as "dry offset" printing, have recently been regarded as promising. However, a printing press for printing with a printing plate having a low relief height must have a fairly high degree of precision to prevent ink staining of non-image areas, and care must be exercised in the maintenance of the same.

On the other hand, image areas of a lithographic printing plate used for conventional lithographic printing require no relief height. Even if there is some relief height, it is at most several microns, or the image areas are lower in height than non-image areas. In lithographic printing plates, the non-image areas are rendered hydrophilic and water is retained in the non-image areas during printing to prevent the ink staining of these areas. This naturally leads to problems during printing, and various restrictions are imposed on this type of printing. With a view to overcoming such difficulties, lithographic plates which do not use water have been suggested in which non-image areas are made of an ink-repelling substance, such as a silicone resin, and such have come into use to some extent. However, this technique still has disadvantages such as the need for using special ink.

In view of the state of the art, we performed extensive investigations into relief printing plates having relatively low reliefs with which printing can be performed on a conventional relief printing press without staining of non-image areas, which led to the present invention.

SUMMARY OF THE INVENTION

The printing plate of this invention is a novel printing plate characterized by an image area consisting of reliefs with a height of at least 0.05 mm and a non-image area having a number of small projections with a height of at least 0.01 mm, the height of the small projections being lower than that of the reliefs.

DETAILED DESCRIPTION OF THE INVENTION

In the present specification the term "small projections" is used to describe discontinuous protrusions in non-image areas which occur between the reliefs and which prevent bottoming. The small projections are not particularly limited as to shape, but generally have a height greater than their longest lateral dimension (with reference to the support), and most preferably, but not necessarily, exhibit a greater lateral dimension at their contact point with the support than at their top. While the small protrusions need not necessarily be substantially perpendicular to the support and parallel to the reliefs, best results are only obtained when they are substantially perpendicular to the support and parallel to the reliefs, with their longest dimension parallel to the reliefs. Most common shapes for the small projections include: conical, frustoconical, pyramidal, cylindrical, spherical, rectangular and hemispherical, though other polygonal and irregular shaped small protrusions can also be used.

Figure 1:
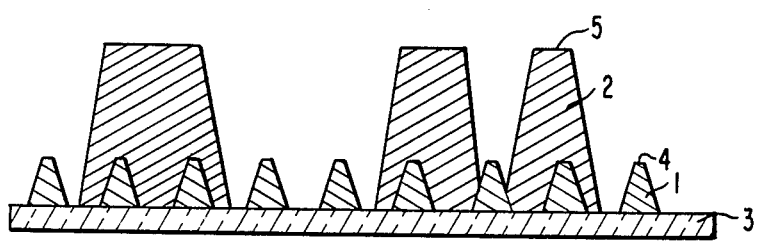
FIG. 1 is a schematic sectional view of a printing plate formed in accordance with the present invention.

FIG. 1 is a schematic sectional view of the printing plate of this invention. Reference numeral 1 represents the small projections; 2 the reliefs; and 3 a base plate. In the printing plate of this invention, the small projections present in the non-image area serve to prevent bottoming. In the case of a relief printing plate with relatively low reliefs which does not have such small projections, ink sits in the bottom areas between the reliefs, that is, in the non-image areas, and is transferred to a material being printed, thus causing bottoming (staining of non-image areas). In contrast, according to this invention, the presence of the small projections prevents ink staining of the non-image areas, and even if ink stains the non-image areas, it is only printed as minute dots and does not result in an appreciable degree of bottoming.

As such a printing plate, there can also be used a printing plate whose entire surface is a halftone image, with parts corresponding to non-image areas of the original being highlight tones and the small projections being present as highlight dots. With such a printing plate, the height of the top of the small projections becomes equal to that of the reliefs as an image area, and at the time of printing, the small projections are clearly printed. Thus, the entire printed matter becomes dark, and the small projections are printed even in a non-image area of small size. This results in a reduction in resolving power and poor reproducibility of fine design patterns. Furthermore, this printing plate suffers from the inconvenience of requiring halftone photography for all originals.

In lithographic printing plates used in conventional lithographic printing, the surface of an aluminum or zinc plate as a base is grained by mechanical, chemical or electrical means to roughen it. Therefore, in lithographic printing plates, that part of the base which corresponds to the non-image area is roughened. The purpose of such graining, however, is to render coating of a photosensitive layer thereon easy, increase the adhesion of images in image areas to the base plate, increase the hydrophilicity of the non-image areas, or to increase the retention of dampening water. Thus, in the case of printing plates having substantially no relief height, such as lithographic printing plates, even when the non-image areas are roughened, acceptance of ink to these non-image areas cannot be prevented unless dampening water is used. Furthermore, since the purpose of surface roughening is as mentioned above, the degree of roughness is small (usually, about 1 micron or less), and small projections are not positively provided as in the present invention.

In contrast, the printing plate of the present invention is characterized by having image areas consisting of reliefs with a height of at least 0.05 mm and non-image areas containing a plurality of samll projections with a height of at least 0.01 mm, the height of the small projections being lower than that of the reliefs.

Since the printing plate of this invention contains reliefs with a height of at least 0.05 mm, bottoming of non-image areas is prevented by the action of the small projections provided therein without using the damping water which is required in conventional lithography.

The height of the small projections in FIG. 1, that is, the distance from the surface of the base 3 on which the small projections 1 are present to the top of the small projections 4, must be at least 0.01 mm. If it is less than 0.01 mm, the effect of preventing bottoming is insufficient. Furthermore, the small projections must be present in large numbers.

A suitable number of small projections capable of providing a sufficient effect of preventing bottoming is at least about 20, preferably at least 100, per square centimeter. The objects of this invention can be achieved when the number of the small projections is not more than about 4,000 per square centimeter; when the number of small projections is increased beyond this limit the bottoming preventing effect does not significantly increase while the preparation of such small projections becomes difficult; accordingly, such is economically disadvantageous. There is no particular limitation on the shape or number of the reliefs.

It is not necessary that all of the small projections present have a height of at least 0.01 mm; it is sufficient if the number of small projections which have a height of at least 0.01 mm is within the above range, and small projections of a height of less than 0.01 mm may be mixed with the higher small projections as described above. Since they have no beneficial effect, their presence can be ignored.

The top 4 of a small projection 1 gives a greater effect when it is smaller in area. Preferably, its area is not more than 0.04 mm$^2$. The shape of the top may be any shape, such as circular or polygonal. When the top is circular, the diameter is preferably not more than 0.25 mm, and when the top is polygonal, the length of the largest measurement diagonal is preferably not more than 0.25 mm. As later explained, when the top area is essentially infinitely small, e.g., pyramid or true cone, the top area is represented by a lateral sectional plane taken 10 microns below the actual top of the small projection.

The shapes of the small projections as a whole are not particularly restricted; they can be, for example, a cylinder, a cone, a pyramid, a sphere, a hemisphere or an irregular granule. Preferably, they are conical or pyramidal in shape.

It is preferred that the tops of the small projections be as small in area as possible, and their areas at the portion bonded to the base plate be as large as possible so that they are not knocked off during printing. Accordingly, small projections of a conical or pyramidal shape are most suitable.

With conical or pyramidal points, the area of the top could be made essentially infinitely small. However, since adhesion of ink during printing occurs entirely in the vicinity of the top, the sectional area of the small projections at a position 10 microns below their top is preferably within the above-specified range. Usually, the top will be used for the area measurement, of course, but where the top is (essentially) a point (cone, triangle) this measurement is made 10 microns down. Most preferably, the diameter or the length of the bottom at its largest measurement is at least about 1/5 the height of the small projections.

In order to secure a sufficient bottoming preventing effect at non-image areas, it is preferred that the total sectional area of the tops of all of the small projections (measured at a distance 10 microns below the top thereof for shapes such as cones, pyramids) should be not more than 30% of the area of one side of the base plate 3; small projections having a height of less than 0.01 mm are not included, of course.

The top 4 of a small projection is lower than the top 5 of the relief, and the distance between the top 4 and the top 5 is preferably at least 0.05 mm. When the height of the small projections are substantially the same as that of the reliefs, that is, when the distance between the point 4 and the point 5 is small, a halftone image in the image area and in the area of the small projections is printed, and sometimes, a moire pattern occurs.

The height of the relief of the printing plate in accordance with this invention must be at least 0.05 mm. There is no particular restriction to the upper limit of the height of the relief, but since the purpose of this invention is to provide a printing plate having a relatively low relief height, it is sufficient for most printing processes if the height of the relief is at most 0.5 mm.

Furthermore, as the relief height is preferably higher than that of the top of the small projection by at least 0.05 mm, a preferred relief height is thus within the range of 0.06 to 0.5 mm.

Although the present invention gives printing plates having a relatively low relief height, the plates may comprise reliefs with a height of more than 0.5 mm when the bottoming of non-image areas cannot be prevented unless the relief height is higher, e.g., at least 0.5 mm (for example, in the case of printing paper boards, a relief height of more than 2 mm is required for printing).

A preferred method for making the printing plate of this invention comprises superimposing a layer of a photosensitive resin on a base plate, which is transparent or semitransparent to actinic light, in intimate contact therewith, exposing the assembly to actinic light from the side of the photosensitive resin layer through an image-bearing transparency (such as a negative photographic film), and also exposing the assembly to actinic light from the side of the transparent or semitransparent base (such as, e.g., a copying paper) base through a dot-image-bearing transparency to form small projections in non-image areas. The size of the small projections obviously varies depending upon the distance of the dot-image-bearing transparency from the photosensitive resin layer. Therefore, it is not preferred that the distance between the base plate (support) and the dot-image-bearing transparency be too great during exposure, and the distance is preferably within 20 mm.

Figure 2:
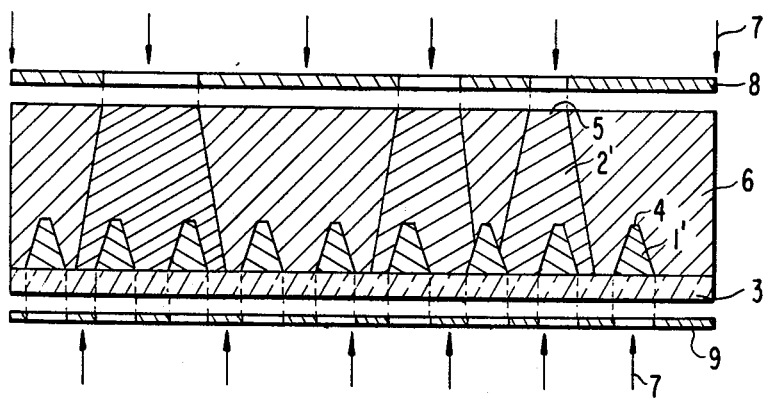
FIG. 2 is a schematic representation of an exposure sequence utilized for forming a printing plate in accordance with the present invention.

FIG. 2 illustrates in schematic form the method of this invention. A photosensitive resin layer 6 is superimposed on a transparent or semi-transparent member 3 in intimate contact therewith, and the resulting assembly is exposed to actinic light 7 through an image-bearing transparency 8 to cure portions 2' which correspond to the transparent areas. On the other hand, actinic light is irradiated from the side of the transparent or semi-transparent member 3 through a dot-image-bearing transparency 9 to cure portions 1' which correspond to the small projections. While it is generally preferred that the small projections have a uniform numerical distribution in areas where they occur, this is not mandatory so long as a sufficient number of small projections are within the range heretofore set forth (at least about 20/cm$^2$).

The unexposed or uncured portions are washed away (developed) by any conventional method used to form printing plates to provide the assembly as illustrated in FIG. 1, in which cured portions 1' and 2' as shown in FIG. 2 are left as small projections 1 and relief areas 2 as shown in FIG. 2 are left on the transparent or semi-transparent member 3.

The photosensitive resin used in the present invention is a resin which is cured upon exposure to actinic light, or which has reduced solubility in a solvent as compared to its solubility before exposure to actinic light. Such a photosensitive resin composition, for example, comprises a compound containing an addition-polymerizable unsaturated group as the main ingredient and a photopolymerization initiator. There are no particular limitation on the properties of these components so long as a photocurable composition of sufficient mechanical strength to be useful is achieved, nor is there any special limitation in the molecular weight of the resulting photopolymer.

Examples of such compounds containing an addition-polymerizable group are acrylic acid, methacrylic acid, esters of these acids, for example, alkyl, cycloalkyl, tetrahydrofurfuryl, allyl, glycidyl, or hydroxyalkyl acrylates or methacrylates, mono- or di-acrylates and methacrylates of alkylene glycols or polyoxyalkylene glycols, trimethylol propane triacrylate and methacrylate and pentaerythritol tetraacrylate and methacrylate; acrylamide, methacrylamide or their derivatives such as N-methylol acrylamide and methacrylamide, N,N'-alkylene bisacrylamides and methacrylamides, and diacetone acrylamide and methacrylamide; addition-polymerizable unsaturated monomers such as styrene, vinyl toluene, divinyl benzene, diallyl phthalate, triallyl cyanurate, vinyl acetate or acrylonitrile; unsaturated polyesters; alkyd resins; and unsaturated polyurethane resins such as polyurethane resins modified with an addition-polymerizable unsaturated monomer having an active hydrogen such as a hydroxyalkyl acrylate or methacrylate.

Examples of photopolymerization initiators are benzoin, benzoin alkyl esters, α-methylbenzoin and alkyl ethers, α-phenylbenzoin, α-allylbenzoin, anthraquinone, chloroanthraquinone, methylanthraquinone, ethylanthraquinone, benzil, diacetyl, acetophenone, ω-bromoacetophenone, α-naphthalenesulfonyl chloride, diphenyl disulfide, and dyes such as eosine or thionine.

The photosensitive resin composition comprises at least one compound containing an addition-polymerizable unsaturated group and a photopolymerization initiator, and, if desired, a heat polymerization inhibitor to increase storage stability such as hydroquinone, p-methoxy phenol, catechol, tert-butyl hydroquinone, benzoquinone, p-phenylenediamine, picric acid, or phenothiazine.

Examples of such photosensitive resin compositions are disclosed in U.S. Pat. Nos. 2,760,863; 2,902,365; 2,927,023; 2,929,710; 2,972,540; 2,997,391; 3,695,877; 3,677,920; and 3,858,510.

There can also be used a composition comprising a polymeric compound which is soluble in water or an alkaline aqueous solution, such as polyvinyl alcohol, polyvinyl alcohol derivatives, cellulose derivatives, polyacrylic acid, polyacrylamide or an alcohol-soluble polyamide, the addition-polymerizable unsaturated compound and the photopolymerization initiator, and, if desired, a heat polymerization inhibitor, and the composition comprising a polyene, a polythiol and a photosensitizer as disclosed in Japanese Patent Publication No. 29525/71.

The polymeric compound mentioned above serves to increase the physical properties and the washing-out capability after photocuring and to solidify the resin composition at room temperature prior to photocuring (since most of the unsaturated compounds are liquid at room temperature). It is preferably used in an amount of about 90 wt% or less of the composition weight.

The photosensitive resin composition exemplified above is usually coated in layer form on a support member which is transparent or semi-transparent to actinic light in intimate contact therewith.

The support member which is transparent or semi-transparent to actinic light may, for example, be a plastic film or sheet, cellophane film, paper, glass sheet, glass cloth, or fabric. Plastic sheets are especially preferred, e.g., films or sheets of plastics such as polyethylene terephthalate, polycarbonate, polypropylene, polyvinyl chloride, polystyrene, polyvinyl alcohol, polyacrylonitrile, polymethyl methacrylate, nylon, or acetyl cellulose. The support will generally have a thickness of 0.01 to 1 mm, more preferably 0.05 to 0.5 mm.

It is often effective to provide an adhesive layer on the side of the support member which makes contact with the photosensitive resin layer to increase adhesion in the final printing plate between these two layers. Examples of suitable adhesives which can be used to form such an adhesive layer include polyurethane resins, epoxy resins, polyester resins, melamine resins, urea resins, polyacrylates, natural rubbers or synthetic rubbers such as polychloroprene rubber, nitrile rubber, styrene-butadiene rubber, butyl rubber and the like, polyvinyl acetate, polyvinyl chloride, polyvinyl butyral, cellulose acetate propionate and cellulose acetate butyrate as disclosed in U.S. Pat. No. 2,760,863. The structure disclosed in British Pat. No. 1,321,108 is exemplary of a transparent or semi-transparent support member having an adhesive layer formed thereon.

The image-bearing transparency is suitably a negative film with a silver salt image. There can also be used a material which is substantially transparent to actinic light, such as a plastic film or sheet, a glass sheet, a regenerated cellulose film or paper, on which a negative image is formed by means such as printing, copying or transferring.

The dot-imaged-bearing transparency can be a halftone dot film prepared by uniformly exposing a photographic film through a contact screen or glass screen. A dry plate such as glass dry plate can also be used instead of the film.

The term "dot-image-bearing transparency" is used in a broad sense as the dots can have any shape and the percentage area of the transparency occupied by the dots is relatively flexible. Most commonly, the dot-image-bearing transparency is a halftone dot screen (or screened film, as such halftone dot screens are often termed in the art). The most common form of a halftone dot screen comprises a plurality of crossing screen rulings which define the "dots" by the areas therebetween. Such are conventional in the art and will not be further described at this point in the specification.

The screen ruling of the halftone dot film is not particularly restricted, but to obtain a preferred number of small projections it is preferably 30 lines/inch to 150 lines/inch.

There can also be used a dot-image-transparency formed by providing dot images on the above-mentioned substantially transparent material by various means such as printing, copying or transferring, and a dot-image-bearing transparency prepared by forming dot images by perforating a film, sheet or metal plate which is non-transparent to actinic light.

In order to obtain suitable small projections, the area proportion of the transparent portion of the dot-image-bearing transparency which is to form small projections is preferably 1 to 40%. When the area proportion is less than 1%, it is difficult to form small projections by the method of this invention. When it exceeds 40%, it is difficult to obtain small projections suitable for sufficiently preventing the staining of non-image areas.

According to the method of this invention, actinic light is irradiated through the dot-image-bearing transparency to cure that portion of the photosensitive resin layer which corresponds to the transparent portions of the dot-image-bearing transparency to a height of at least 0.01 mm, and thus form small projections. The irradiated actinic light, after falling upon the photosensitive resin layer, decreases in intensity as it proceeds farther inside the resin layer. Accordingly, the cured portion becomes progressively smaller in area as the light advances deeper into the inside of the photosensitive resin layer. In other words, the small projections formed become tapered as they depart from the base plate, and in such form are preferred for use in this invention.

However, when the amount of exposure through the dot-image-bearing transparency becomes very large, portions corresponding to the small projections are cured to a height corresponding to the thickness of the photosensitive resin layer, whereafter curing in the transverse direction begins to increase the area of the small projections. Hence, the amount of exposure should be very carefully controlled. Also, in this case the height of the small projections becomes equal to that of the relief, and the printing plates of this invention cannot be prepared.

Accordingly, the amount of exposure through the dot-image-bearing transparency should be so adjusted that the height of the small projections is lower than that of relief image areas (the height of the reliefs being essentially equal to the height or thickness of the photosensitive layer); in other words, the height should be adjusted so that the exposed area is cured to a height lower than that corresponding to the thickness of the photosensitive resin layer. When the amount of exposure is adjusted within such a range, the shape of the small projections becomes preferred as described above. Furthermore, as described above, this adjustment is preferably effected so that the height of the small projections becomes lower than that of the relief by at least 0.05 mm. As a general rule, the preferred exposure will be determined empirically by measuring the height of the small projection after a trial run until the desired exposure conditions are reached.

The side surfaces of the reliefs are preferably inclined so that the relief becomes progressively thicker as it approaches the base plate. However, since the curing of portions corresponding to the reliefs is performed by irradiation through an image-bearing transparency from the side opposite the support, irradiation must be effected to a sufficient extent, which is contrary to the case of preparing the small projections; phrased differently, it is necessary to provide an amount of exposure sufficient to cure in relief areas sufficient to provide reliefs with inclined surfaces, which can be approximated by exposing the photosensitive resin layer as if it had a thickness greater than its actual thickness. One means of providing an inclination to the side surfaces of the reliefs is by employing the method disclosed in U.S. Pat. No. 2,760,863 (corresponding to British Pat. No. 741,441) in effecting irradiation at the time of relief preparation.

Irradiation of actinic light to cure relief portions as image areas and irradiation of actinic light to cure the small projections in non-image areas should be correlated with each other. The amount of exposure varies according to the intensity of the light source used, the photocuring rate and thickness of the photosensitive resin and with other components of the printing plate, e.g., degree of transparency of the support of this invention. The amount of exposure required can, however, easily be determined by a few trial runs at, for example, varying exposure times. When the same light source is used for curing relief portions and small projection portions, it is sufficient if the amount of exposure required to cure the small projection portions is less than one half that required to cure the relief portions.

During irradiation with actinic light, the image-bearing transparency, the photosensitive resin layer, the dot-image-bearing transparency and the transparent or semi-transparent support are preferably in intimate contact with each other to insure accurate reproduction of images. When the photosensitive resin is liquid, or is a solid but with a tacky surface, the provision of an interlayer between the image-bearing transparency and the photosensitive resin layer is advisable to protect the image-bearing transparency or to prevent adhesion of the image-bearing transparency to the photosensitive resin layer after exposure.

As such an interlayer, a thin transparent pre-formed plastic film is generally used. Examples of such are polypropylene, polycarbonate, polyethylene terephthalate, acetyl cellulose, polyvinyl alcohol, cellophane film, and the like. The film preferably has a thickness of 5–50 $\mu$ and can be peeled off after curing.

The objects of this invention can also be achieved by using the dot-image-bearing transparency as earlier described to simultaneously serve as the transparent or semi-transparent support. In this case, an adhesive layer as earlier described is preferably provided on that side of the dot-image-bearing transparency with which the photosensitive resin layer makes contact.

The sources of actinic light used for exposure in the present invention can be freely selected and include, for example, arc lamps, mercury lamps, xenon lamps, fluorescent lamps, ultraviolet light sources and sunlight, which contain radiation of a wavelength of 200–800 m$\mu$, preferably 300 to 500 m$\mu$.

After exposure to actinic light, the uncured portion of the photosensitive resin layer is removed by a conventional method using various solvents or solutions, for example, water, aqueous solutions such as alkaline aqueous solutions, e.g., solutions of NaOH, NaCO$_3$, NaHCO$_3$, borax, sodium phosphate, sodium silicate, triethanolamine, or the like, or aqueous solutions of surface active agents, e.g., a soap, alkylbenzene sulfonates, alkylsulfonates, alkylamine chlorides, polyoxyalkylene glycols, polyoxyalkylene glycol alkylethers, polyoxyalkylene glycol alkylesters, sorbitan fatty acid esters, polyoxyalkylene glycol sorbitan acid esters, etc., and organic solvents such as alcohols, e.g., methanol, ethanol, isopropanol, etc., acetone, benzene or trichloroethylene. If the photosensitive layer is liquid before exposure to actinic light, the unexposed portion(s) can also be removed by vacuum suction, scattering by centrifugal force or by blowing compressed air thereon.

In the method of this invention, exposure to actinic light through the image-bearing transparency and exposure to actinic light through the dot-image-bearing transparency can be effected separately, in any desired sequence, or simultaneously.

Before performing the exposure(s), the entire surface of the assembly can, if desired, be exposed from the side of the transparent or semi-transparent support member with the dot-image-bearing transparency removed. This pre-exposure procedure is effective for the formation of reliefs and small projections if it is carried out to an extent which does not cure the photosensitive resin layer, that is, to an extent which provides an excited state. When a preliminary exposure is used within the range such that curing is not initiated, photopolymerization can immediately occur in a sequential step when additional exposure is applied; this state is called the "excited state". Usually the exposure to provide the excited state is about 1/10 or less of that required for the relief exposure.

Since the thickness of the photosensitive layer corresponds to the relief height, it is most preferably within the range of 0.06 to 0.5 mm. When reliefs having a larger height are required, the thickness of the photosensitive layer may be larger than that specified above.

Since the photosensitive layer to be cured in the preparation of the printing plate by the method of this invention can be thinner than that in conventional photosensitive resin plates, the exposure time can be shortened and the accuracy of image reproduction can be increased.

Another method of preparing the printing plate of this invention involves using a base or support having formed thereon small projections as described above as a support, superimposing a photosensitive resin layer (as earlier described) on that surface of the support which contains the small projections in intimate contact therewith, and then subjecting the assembly to conventional photosensitive resin plate manufacturing procedures as described, for example, in U.S. Pat. No. 2,760,863. Duplicate plates may be prepared from the resulting plate as an original. Specifically, such a support having small projections is arranged in intimate contact with the photosensitive resin layer by, for example, coating the photosensitive resin layer thereon, and actinic light is irradiated onto the photosensitive resin layer through an image-bearing transparency (such as a negative photographic film) to cure exposed portions. Then, the uncured portions are washed away to form relief images on the support containing the small projections.

If desired, using the resulting printing plate as an original, duplicate printing plates can be prepared by ordinary methods of duplicating relief printing plates, such as a stereo method, a rubber molding plate method, a galvanoplate method, a duplicating method using a thermoplastic resin, or the method involving the casting of a liquid photosensitive composition as is disclosed in Japanese Patent Publication No. 39244/73.

The photosensitive resin used in this alternative method is the same as has been earlier described. The photosensitive resin composition is superimposed in layer form, preferably at a thickness of 0.06 to 0.5 mm, on the support containing the small projections in intimate contact therewith, and used in the preparation of printing plates by the alternative method of this invention.

As in the first-described embodiment of this invention, the image-bearing transparency and the photosensitive resin layer are preferably disposed in intimate contact with each other in view of the accuracy of image reproduction. When the photosensitive resin is liquid, or is solid but has a tacky surface (a non-tacky solid is preferred), the provision of an interlayer as earlier described between the image-bearing transparency and the photosensitive resin layer is desirable to protect the image-bearing transparency or to prevent adhesion of the image-bearing transparency to the photosensitive resin layer after exposure.

After exposure to actinic light, the uncured portions of the photosensitive resin layer can be removed by washing in the same manner as hereinbefore described.

The thickness of the photosensitive layer is prescribed so that the above-mentioned relief height can be obtained, and is preferably 0.06 to 0.5 mm.

The support used in the present invention is not restricted with respect to either material or thickness; usually, however, it is a film or sheet of a thickness of 0.01 to 1 mm, preferably 0.05 to 0.5 mm, made of various plastics such as have been earlier described, metals such as steel, copper, aluminum, zinc, magnesium, etc., paper, glass, glass cloth, fabrics, etc. Transparent or nontransparent supports can be used, depending on the embodiment involved.

Various methods are available to prepare a support consisting of a base plate with small projections thereon. For example, a photosensitive resin layer having a thickness corresponding to the height of the required small projections can be superimposed on a base plate in intimate contact therewith, and the resulting assembly subjected to a conventional platemaking method for photosensitive resin plates using a halftone dot film as an image-bearing transparency. Alternatively, a resist such as a water-soluble bichromate colloid, polyvinyl cinnamate, etc., is coated on a metal plate, for example, a zinc plate, magnesium plate, copper plate, etc., and in accordance with conventional methods, such as etching for the preparation of metal relief printing plates, a halftone plate comprising less than 30 area % highlight tones is made for use as the support. Further, a plastic sheet can be used as the support, and made into the support by embossing to form the small projections thereon. Furthermore, it is possible to bond a number of minute granules, which meet the earlier recited limitations on the small projections, to the base plate to serve as the small projections.

Duplicate plates can be prepared from the abovedescribed printing plates as an original by various methods, for example, a paper matrix stereo type method which comprises making a paper matrix by a rolling press or a direct pressure process and then casting type metal thereon, forming a rubber plate or plastic plate by forming a Bakelite matrix and hotpressing it using unvulcanized rubber or a thermoplastic resin as a platemaking material, or imparting electrical conductivity to a matrix prepared from the original, and electrodepositing copper, iron, or nickel, etc., thereon to form a galvanoplate.

As stated hereinabove, the method of this invention gives printing plates having relatively low relief images which can be used on ordinary relief printing presses without causing bottoming; no special printing press is required.

The present invention has the advantage that the thickness of a photosensitive layer as an image area can be smaller than in a conventional photosensitive resin plate. This is not only economically advantageous, but also shortens the exposure time and improves the accuracy of reproduction.

The following Examples are to illustrate the present invention without limiting the same.

Unless otherwise indicated, all thicknesses are dry thicknesses.

Further, in all Examples there were more than 20 but less than 4,000 small projections per square centimeter, and the number of small projections of a size less than 0.01 mm was negligible.

EXAMPLE 1

To 100 parts by weight of a polyester resin (acid value 35; molecular weight about 1,700) obtained by polycondensing propylene glycol, diethylene glycol, adipic acid, fumaric acid and isophthalic acid in a molar ratio of 0.30/0.20/0.15/0.25/0.10 were added 10 parts by weight of 2-hydroxymethacrylate, 20 parts by weight of diethylene glycol dimethacrylate, 10 parts by weight of diacetone acrylamide, 1 part by weight of benzoin ethyl ether and 0.1 part by weight of p-methoxy phenol. These components were thoroughly mixed to form a photosensitive resin composition.

A plate-making negative film for newspaper having a size corresponding to one page of a newspaper was placed on a horizontal glass plate, and covered with a polypropylene film having a thickness of 20 microns. The photosensitive resin composition was then cast onto the polypropylene film using a doctor knife to a thickness of 0.2 mm. Onto the cast layer of the photosensitive resin composition there was then laminated a 100 micron-thick polyethylene terephthalate film which had coated on one surface with a polyurethane adhesive (a mixture of Nippolan 3002 (trademark for a product of Nippon Polyurethane Kogyo; a polyester polyol) and Coronate L (polyisocyanate) at a weight ratio of 5:1) to a dry thickness of about 10 microns so that the adhesive surface contacted the photosensitive resin layer.

A halftone dot film having a transparent area proportion of 5% and a screen ruling of 85 lines/inch was then placed on the polyethylene terephthalate film. The assembly was exposed for 30 seconds from the negative film side through the glass plate and for 5 seconds through the halftone film to actinic light from a 3 kw water cooled super-high pressure mercury lamp placed 50 cm away from the assembly for both exposures. The glass plate, negative film and polypropylene film were then removed (stripped), and unexposed portions of the photosensitive resin layer were washed with a 1% aqueous solution of borax to remove the same. The assembly was then dried, and re-exposed for 20 seconds using the above lamp at 50 cm from above the reliefs and small projections to complete the cure. Thus, a printing plate for printing newspapers was prepared. The height of the reliefs formed as image areas of this plate was 0.2 mm, and the height of each of the small projections in the non-image area was 0.05 mm. The shape of each of the small projections was that of a truncated cone with a diameter of about 0.08 mm, on the average, at the adhesive surface on the polyester film. The small projections tapered towards their top, and the average diameter at the top was about 0.02 mm. The shape of the reliefs, in cross section, was semi-rectangular, i.e., there was a slight inward taper or shoulder from the bottom to the top, as is preferred in the present invention.

Printing was performed using the resulting plate on a newspaper rotary press. Black small projections were slightly printed partly in the non-image area of the printed matter, but such were insufficient to be considered bottoming.

For comparison, a printing plate having relief images with a height of 0.2 mm was prepared in the same way as above except that the exposure from the halftone dot film was omitted. Printing was performed using the resulting plate in the same way. The printing was inferior as bottoming occurred in most of the non-image areas except for a very small area.

EXAMPLE 2

The same polyurethane adhesive as was used in Example 1 was coated to a thickness of about 5 microns on the surface of a halftone dot film having a transparent area proportion of 5% and a screen ruling of 85 lines/inch which had been made from a photographic film comprising a 100 micron-thick polyethylene terephthalate film as a base.

The same procedure as in Example 1 was repeated except that this halftone dot film replaced the polyethylene terephthalate film used in the assembly of Example 1. A printing plate substantially identical to that of Example 1 was obtained.

EXAMPLE 3

A mixture consisting of 90 parts by weight of polyvinyl alcohol (having a saponification degree of 80% and an average degree of polymerization of 500), 30 parts by weight of 2-hydroxyethyl acrylate, 30 parts by weight of triethylene glycol dimethacrylate, 1 part by weight of benzoin ethyl ether, 0.1 part by weight of hydroquinone and 150 parts by weight of water was cast on a plate-making negative film (as was used in Example 1), which was carried on a glass plate and dried by hot air to form a layer of photosensitive resin composition having a thickness of 0.20 mm.

The photosensitive layer was then bonded at its exposed surface to a 100 micron-thick polyethylene terephthalate film via a thin layer of an adhesive composed of polyvinyl butyral.

The assembly was then exposed through the plate-making negative film via the glass plate for 40 seconds to actinic light from a 3kw water cooled super-high pressure mercury lamp 50 cm from the assembly.

A halftone dot film having a transparent area proportion of 3% and a screen ruling of 85 lines/inch was superimposed on the surface of the polyethylene terephthalate film of the above assembly, and the assembly was exposed through the halftone dot film for 15 seconds using the same light source and distance as above.

The unexposed portions were removed by washing with water at 40° C and the assembly dried to prepare a printing plate. The height of the reliefs in the image areas was 0.20 mm, and the height of the small projections in the non-image areas was 0.04 mm.

The shape of each of the small projections and reliefs was substantially the same as in Example 1. The diameter of the small projections at the adhesive surface on the polyethylene terephthalate film was about 0.06 mm on the average, and the diameter near the top was about 0.01 mm on an average.

Printing was performed using the resulting printing plate on a proof press for relief printing. The resulting printing was good in quality without staining of the non-image areas.

EXAMPLE 4

A plate-making negative film having a size corresponding to one page of a newspaper (as in Example 1) was placed on a horizontal glass plate and covered with a polypropylene film having a thickness of 20 microns. The same photosensitive composition as was used in Example 1 was cast onto the polypropylene film to a layer thickness of 0.3 mm. Onto the cast photosensitive resin layer there was laminated a 100 micron thick polyethylene terephthalate film coated on one surface with a 10 micron layer of a polyurethane adhesive [a mixture of Nippolan 3002 (polyester polyol) and Coronate L (polyisocyanate) a product of Nippon Polyurethane Kogyo] at a weight ratio of 5:1, so that the adhesive surface of the polyethylene terephthalate film contacted the photosensitive resin layer.

Further, a halftone dot film having a transparent area proportion of 15% and a screen ruling of 85 lines/inch was placed on the polyethylene terephthalate film, and the assembly then exposed for 45 seconds through the glass support and for 5 seconds from the halftone dot film side using a 3KW water cooled super-high pressure mercury lamp 50 cm from the assembly. The glass plate, negative film and the polypropylene film were then removed, and the unexposed portions of the photosensitive layer washed with a 1% aqueous solution of borax to remove the same. The resulting product was dried and re-exposed from above the reliefs and small projections for 20 seconds at 50 cm. with the same light source as was used above to complete the photocure.

A printing plate for printing newspapers was thus prepared. The height of the relief as image areas of this plate was 0.3 mm, and the height of each of the small projections of the non-image areas was 0.07 mm. Each of the small projections had a diameter of about 0.12 mm at the adhesive surface and about 0.03 mm a the top of the cured photosensitive layer. The reliefs and small projections had shapes similar to those of Example 1.

Printing was performed using this printing plate on a rotary press for newspapers. The resulting printing was free from the staining of non-image areas.

For comparison, a printing plate having relief images with a height of 0.3 mm was prepared in the same way as above, except that exposure from the halftone dot film was omitted. Using the resulting printing plate, printing was performed in the same way as above. Printing was very poor in quality with the occurrence of bottoming in substantial portions of the non-image area, only small areas being free of bottoming.

EXAMPLES 5 to 18

In each of the following runs, a printing plate with a relief height of 0.4 mm as shown in Table 1 was prepared in the same way as in Example 1 except that the photosensitive resin composition was spread to a thickness of 0.4 mm using a doctor knife, the halftone dot films shown in Table 1 were used and exposure from the side of the halftone dot film was carried out for the exposure times shown in Table 1.

Printing was performed using each of the printing plates obtained. Except for the printing plate obtained in the Reference Example, the printing obtained was good in quality without the staining of the non-image areas. The printing obtained using the printing plate obtained in the Reference Example contained black points all over the surface of the non-image areas, and moire occurred in the halftone dot portions of the image areas. The quality of the printing was deemed poor.

Table 1

| | | Halftone-dot Film | | Shape of the Small Projection* | |
|---|---|---|---|---|---|
| Ex. | Exposure time (sec.) | Screen ruling (lines/inch) | Area protion of transparent portion (%) | (mm) Height | Average diameter of the bottom** (mm) | Average diameter near the top (mm) |
| 5 | 5 | 45 | 10 | 0.13 | 0.22 | 0.06 |
| 6 | 5 | 65 | 5 | 0.05 | 0.10 | 0.03 |
| 7 | 5 | 65 | 10 | 0.08 | 0.14 | 0.04 |
| 8 | 5 | 65 | 20 | 0.12 | 0.20 | 0.05 |
| 9 | 5 | 100 | 10 | 0.05 | 0.09 | 0.02 |
| 10 | 5 | 100 | 15 | 0.07 | 0.11 | 0.03 |
| 11 | 5 | 100 | 25 | 0.09 | 0.14 | 0.04 |
| 12 | 5 | 120 | 10 | 0.06 | 0.08 | 0.02 |
| 13 | 5 | 120 | 20 | 0.07 | 0.10 | 0.04 |
| 14 | 10 | 45 | 10 | 0.18 | 0.25 | 0.07 |
| 15 | 10 | 65 | 5 | 0.12 | 0.12 | 0.05 |
| 16 | 10 | 65 | 10 | 0.16 | 0.15 | 0.06 |
| 17 | 10 | 85 | 5 | 0.09 | 0.09 | 0.03 |
| 18 | 10 | 85 | 15 | 0.13 | 0.13 | 0.03 |
| Reference Ex. | 40 | 85 | 15 | 0.40 | 0.20 | 0.30 |

*Shape was conical; average diameter near the top measured 10 μ below the top
**The diameter at the surface bonded on the polyethylene terephthalate film.

EXAMPLE 19

Following the procedure of Example 1, the photosensitive resin was entirely exposed for 0.5 second through the polyethylene terephthalate film prior to placing the halftone dot film on the polyethylene terephthalate film to bring the same to the "excited state". The halftone dot film was then placed on the polyethylene terephthalate film and the assembly exposed for 20 seconds through the glass plate and the negative and for 3 seconds through the halftone dot film. The lamp and distance used for all three exposures were the same as in Example 1, the time of exposure being varied as indicated. The unexposed portions were washed away as in Example 1. The resulting printing plate was the same as obtained in Example 1.

EXAMPLE 20

Following the procedure of Example 4 except for varying as set forth below, the photosensitive resin was entirely exposed for 0.5 second as in Example 19 (pre-exposure to provide the excited state of the photosensitive resin) through the polyethylene terephthalate film side prior to placing the halftone dot film thereon and, of course, prior to exposure from the halftone dot film side and the negative film side. The assembly was then exposed for 3 seconds from the halftone dot film side and for 25 seconds from the negative film side using the lamp and distance as in Example 4. The resulting printing plate was the same as obtained in Example 4.

EXAMPLE 21

The procedure of Example 1 was repeated except that each of a 0.1 mm-thick cellulose triacetate, polycarbonate, polypropylene and polyvinyl chloride film were used instead of the polyethylene terephthalate film. The resulting printing plates were the same as obtained in Example 1.

EXAMPLE 22

A polyurethane adhesive (a mixture of Nippolan 3002 and Coronate L in a weight ratio of 5:1, supplied by Nippon Polyurethane Kogyo) was coated to a thickness of about 5 microns on a 0.1 mm-thick polyethylene terephthalate film. The same photosensitive resin composition as was used in Example 1 was coated to a thickness of 0.05 mm on the adhesive-coated surface of the polyethylene terephthalate film, and then the photosensitive resin layer was covered with a polypropylene film of thickness of 12 microns. A halftone dot film having a transparent of area proportion of 7% and a screen ruling of 65 lines/inch was placed on the polypropylene film. The assembly was then exposed for 10 seconds to actinic light from a 3 KW high pressure mercury lamp placed 50 cm from the assembly. The halftone dot film and polypropylene film were then removed, and unexposed portions were washed with a 1% aqueous solution of borax to remove the same, followed by drying to prepare a support.

The height of each conical small projection on the polyethylene terephthalate film was 0.05 mm, and the diameter of each minute point 10 82 below the top was 0.115 mm, which was substantially the same in size as the transparent portions of the halftone dot film. The area of the top of the small projections was 0.01 mm², and the summation of all of the areas of the tops was 6.6% of the total support area of the side carrying the small projections.

The support was placed with the small projections facing upward and the same photosensitive resin composition as was used in Example 1 was cast onto the support to a thickness of 0.30 mm from the polyethylene terephthalate film surface. The photosensitive resin layer was covered with the same polypropylene film as was used above, and a plate-making negative film having a size corresponding to one page of a newspaper as in Example 1 was superimposed on the polypropylene film. The assembly was then exposed for 40 seconds through the negative film using the same high pressure mercury lamp as was used above. Unexposed portions were then washed away as above, followed by drying and re-exposure for 20 seconds from the same light source as above at the same conditions as above. A printing plate was thus prepared.

Printing was performed using the resulting printing plate on a rotary press for newspapers. The printing obtained was of good quality without bottoming in non-image areas.

EXAMPLE 23

A printing plate was prepared in the same way as in Example 22 except that the thickness of the photosensitive resin layer at the time of preparing the relief images was changed to 0.20 mm, and the exposure time was changed to 30 seconds. Printing was performed using the resulting printing plate on a rotary press for newspapers. Black small projections partly printed in the non-image areas, but they were not as conspicuous as bottoming. The printing obtained was of good quality. The reliefs were 0.20 mm high and the small projections 0.05 mm high.

EXAMPLE 24

Using a halftone dot film having a transparent area proportion of 5% and a screen ruling of 85 lines/inch, a commercially available 0.84 mm-thick zinc PS relief plate (P.S. Fine Zinc, a product of Mitsui Kinzoku Kogyo) was subjected to baking and powderless etching in a conventional manner for the preparation of metal relief printing plates. There was obtained a halftone printing plate, the entire surface of which was a highlight tone. The height of each of the highlight dots in the halftone plate was 0.15 mm. The highlight dots were conical and the section 10 $\mu$ below the top of each highlight dot was circular and had a diameter of 0.06 mm which, was smaller than the diameter of the dot of the halftone dot film as an etching process was used.

The same photosensitive resin composition as was used in Example 1 was cast on the resulting halftone printing plate so that no bubbles were present in the layer among the highlight dots and the height of the resulting layer was 0.3 mm above the top of the highlight dots. The resulting layer of photosensitive resin was then covered with a polyethylene terephthalate film having a thickness of 9 microns, and the same negative film as was used in Example 1 was placed on the polyethylene terephthalate film. The assembly was then exposed for 50 seconds to actinic light from a 3 KW high pressure mercury lamp, and then unexposed portions washed away, followed by drying and re-exposing as in Example 22 to form a printing plate having small projections in non-image areas. In this plate, the area of the top of each small projection was 0.0028 mm², and the summation of the areas of the tops was 3% of the total plate area bearing the small projections.

Printing was performed using the resulting printing plate on a plate bed press for a letter press. The printing was of good quality without bottoming in non-image areas.

EXAMPLE 25

A mixture consisting of 90 parts by weight of polyvinyl alcohol (saponification degree 80%, average degree of polymerization 500), 30 parts by weight of 2-hydroxyethyl acrylate, 30 parts by weight of triethylene glycol dimethacrylate, 1 part by weight of benzoin ethyl ether, 0.1 part by weight of hydroquinone and 150 parts by weight of water was cast onto a horizontal glass plate and dried with hot air to form a sheet, about 0.45 mm thick, of the photosensitive resin composition.

The resulting sheet was stripped from the glass plate and superimposed on the highlight dot surface of the halftone zine plate produced in Example 24 and the assembly was subjected to lamination under pressure for 2 minutes at 80° C. and 200 Kg/cm$^2$ to form a laminated plate having a total thickness of 1.10 mm.

The same negative film as was used in Example 1 was placed on the photosensitive resin layer of the resulting laminate and exposed for 60 seconds to actinic light from a 3 KW high pressure mercury lamp placed 50 cm from the laminate. The unexposed portions were removed by washing with warm water at 40° C. to form a printing plate with small projections as in Example 24 and reliefs 0.40 mm high.

Printing was performed using the resulting printing plate on a lithographic press. The printed matter obtained was of good quality free from the bottoming of the non-image area.

EXAMPLE 26

This example deals with the preparation of a matrix wherein plates having a topography which is the negative of those earlier formed result.

Using a halftone dot film having a non-transparent area proportion of about 20% and a screen ruling of 65 lines/inch (the size of each dot in the non-transpatent portions was 0.20 mm), a PS zinc plate as was used in Example 24 was subjected to baking and powderless etching in the same way as in Example 24. A halftone plate with a uniform surface being a shadow tone was thus produced. Each of the dots in the resulting halftone plate had a diameter of 0.25 mm on the surface of the plate and a depth of 0.11 mm. The shape of each dot was substantially conical, and the diameter of the bottom portion was about 0.01 mm.

Using this halftone plate as a matrix, a polyvinyl chloride sheet 0.3 mm thick was pressure laminated thereon at 110° C and 100 kg/cm$^2$. About 650 small projections each having a height of 0.11 mm and a top diameter of about 0.01 mm per cm$^2$ were formed on one surface of the polyvinyl chloride sheet.

A printing plate was produced in the same way as in Example 22 except that the resulting polyvinyl chloride sheet was used as a support. Printing was performed using the resulting printing plate, and the results were as good as in Example 22.

EXAMPLE 27

The printing plate produced in Example 24 was heated to 70° C and exposed for about 2 minutes to actinic light from a 3 kw high pressure mercury lamp 30 cm away to strengthen the relief images.

Using the resulting printing plate as an original, a paper matrix was made by a rolling press, and a curved stereotype was produced by means of a stereotype casting machine. The resulting stereotype was a substantial duplicate of the type of printing plate obtained in Example 24.

Printing was performed using the resulting stereotype on a newspaper rotary press. The printing was good in quality without appreciable bottoming in non-image areas.

COMPARATIVE EXAMPLE

In the preparation of the support in Example 22, the thickness of the photosensitive resin layer was changed to 0.25 mm and the exposure time was changed to 30 seconds. In the resulting support, the height of the small projections was 0.25 mm and the top of each small projection was circular with a diameter of 0.115 mm.

A printing plate having small projections in the non-image areas of the same height as that of the relief images was prepared as in Example 22, except that the thickness of the photosensitive resin layer on the small projection side of the support was 0.25 mm, and the exposure time was changed to 35 seconds.

Printing was performed using the resulting printing plate on a newspaper rotary press. The small projections printed all over the non-image areas, and although they were not quite bottoming, they were imprinted as a fine visual pattern. The printing thus had a poor resolving power, and the small projections and the dots formed moire patterns, leading to poor quality printing.

EXAMPLE 28

A support was prepared in the same way as in Example 22 except that a halftone dot film having a transparent area proportion of 40% and a screen ruling of 65 lines/inch was used. The top of each of the small projections in the resulting support was substantially square with each side measuring 0.25 mm. The area of the top of the small projection was 0.063 mm$^2$, and the summation of the areas of the tops was 41% of the total support area carrying the small projections.

Printing was performed using a printing plate prepared as in Example 22 from the resulting support. In the resulting printing, small projections printed all over the non-image areas except in the neighborhood of the image areas while the printing was not of good quality, it was not quite bottoming.

EXAMPLE 29

A support was prepared in the same way as in Example 28 except for using a halftone dot film having a transparent area proportion of 40% and a screen ruling of 85 lines/inch. The top of each of the small projections in the support obtained was substantially circular with a diameter of 0.21 mm. The area of the top of each small projection was 0.034 mm$^2$, and the summation of the areas of the tops was 39% of the area of the surface of the support carring the small projections. The reliefs and small projections were otherwise the same as in Example 28.

Printing was performed using a printing plate prepared from the resulting support as in Example 1. In the resulting printing, small projections were printed in non-image areas, and the printing was not of good quality; however, bottoming of the non-image areas was not pronounced.

EXAMPLE 30

The same procedure as in Example 1 was repeated except that a 0.20 mm thick polyvinyl chloride film was used instead of the polyethylene terephthalate film coated with the polyurethane adhesive. The resulting printing plate was substantially the same as obtained in Example 1.

EXAMPLE 31

The same procedure as in Example 1 was repeated except that instead of the polyethylene terephthalate film coated with the polyurethane adhesive a 0.10 mm thick polypropylene film (one surface of which had been corona discharge treated) was used, and such was laminated so that the treated surface contacted the photosensitive resin layer. The resulting printing plate was substantially the same as in Example 1.

EXAMPLE 32

To 200 parts by weight of polyethylene adipate diol (molecular weight 2,000) were added 34.8 parts by weight of tolylene diisocyanate and 0.5 part by weight of dibutyl tin laurate, and the mixture was heated at 70° C for 2 hours to form polyethylene adipate containing terminal isocyanate groups. The resulting product was reacted with 100 parts by weight of an ethylene oxide/-propylene oxide copolymer (blockcopolymerized diol containing 35% by weight of ethylene oxide; molecular weight of 2,000) to form a block copolymer containing terminal isocyanate groups. To 300 parts by weight of the block copolymer were added 25 parts by weight of 2-hydroxyethylmethacrylate and 0.1 part by weight of hydroquinone, and the mixture was heated at 70° C for 2 hours to form a polymer.

300 Parts by weight of the resulting polymer were mixed with 75 parts by weight of 2-hydroxyethyl methacrylate, 15 parts by weight of 2-ethylhexyl acrylate, 30 parts by weight of n-butyl acrylate and 6 parts by weight of benzoin ethyl ether to form a photosensitive resin composition.

The resulting composition was coated to a thickness of 0.4 mm on a polypropylene film covering a negative film in the same manner as in Example 1. Then, a polyethylene terephthalate film was laminating onto the photosensitive resin layer obtained. A dry glass plate on which had been photographed half-tone dots (65 lines-/inch with a transparent area proportion of 10%) was placed on the polyethylene terephthalate film, and actinic light was irradiated thereon for 8 seconds through the dry glass plate from a 3 KW high pressure mercury lamp 50 cm from the assembly. The assembly was then exposed for 60 seconds from the negative film side using the lamp and distance described above.

Unexposed portions were removed by washing with a 2% aqueous solution of a sodium alkyl ($C_{12}$) benzenesulfonate, followed by drying to form a printing plate.

The height of the relief image areas of the resulting printing plate was 0.4 mm, and the height of the small projections in the non-image areas was 0.12 mm (average). The shape of the small projections was nearly conical, and they had a diameter of about 0.03 mm 10 $\mu$ below their top. Other dimersion were substantially similar to Example 28.

Printing was performed using the resulting printing plate on a flexographic press. The resulting printing was of good quality without bottoming in the non-image areas.

On the other hand, when a printing plate was produced in the same way as above except that the exposure from the side of the dry glass was omitted, and printing was performed using the resulting plate, the printing was of poor quality with substantial bottoming in non-image areas.

EXAMPLE 33

A 0.6 mm-thick polypropylene sheet was superimposed on a paper matrix prepared as in Example 27, and the assembly was hot-pressed at 110° C and 50 kg/cm$^2$ to prepare a printing plate composed of polypropylene. The resulting printing plate had a total thickness of 0.55 mm, and the same small projections as in Example 24 were formed in the non-image areas. The relief height of the image area was 0.3 mm larger than the height of the small projections.

Printing was performed using the resulting printing plate. The results as in Example 24.

While the invention has been described in detail and with reference to specific embodiments thereof, it will be apparent to one skilled in the art that various changes and modifications can be made therein without departing from the spirit and scope thereof.

What is claimed is:

1. A method for making a printing plate precursor which comprises.
   (a) superimposing a photosensitive resin layer having thickness of transparent or 0.06 mm on a support, which is at least semitransparent to actinic light, in intimate contact therewith;
   (b) exposing the resulting assembly to actinic light through an image-bearing transparency from the side of the photosensitive resin layer opposite the support;
   (c) exposing the assembly to actinic light through a dot-image-bearing transparency having a transparent halftone dot area in a proportion of 1 to 40% from the side of the support to thereby form reliefs on the support as image areas and a number of small projections having a height of at least 0.01 mm., and being lower than the height of reliefs, in non-image areas, wherein steps (b) and (c) may be conducted in the order: (b) and then (c); or (c) and then (b); or simultaneously.

2. The method of claim 1 wherein the dot-image-bearing transparency is a screened film having a screen ruling of 30 to 150 lines/inch.

3. The method of claim 1 wherein photosensitive resin layer comprises a photopolymerizable composition comprising a compound with a polymerizable unsaturated group as a main ingredient and a photopolymerization intiator.

4. The method of claim 1 wherein said support plate is a plastic film or sheet having a thickness of 0.01 to 1.0 mm.

5. The method of claim 1 wherein the support is provided with an adhesive layer thereon.

6. The method of claim 4 wherein the plastic film or sheet is selected from the group consisting of films or sheets of polyethylene terephthalate, polycarbonate, polyrpropylene, polyvinyl chloride and cellulose acetate.

7. The method of claim 1 wherein the thickness of the photosensitive resin layer is at least 0.06 mm, and the height of the small projections is at least 0.01 mm and smaller than that of the reliefs by at least 0.05 mm.

8. A method for preparing a novel printing plate precursor which comprises:
   (a) superimposing a photosensitive resin layer having a thickness of transparent or 0.06 mm on a support at least semi-transparent to actinic light in intimate contact therewith;

(b) exposing the entire surface of the support to an extent that does not cure the photosensitive resin layer;
(c) exposing the resulting assembly to actinic light through an image-bearing transparency from the side of the photosensitive resin layer opposite the support;
(d) exposing the resulting assembly to actinic light through a dot-image-bearing transparency having a transparent halftone dot area in a proportion of 1 to 40% from the side of the support to thereby form on the base plate reliefs as an image area and a number of minute points having a height of at least 0.01 mm, and being lower than the height of the reliefs, in a non-image area, wherein steps (c) and (d) may be conducted in the order; (c) and then (d); or (d) and then (c); or simultaneously.

9. A method for preparing a printing plate precursor which comprises:
(a) superimposing a photosensitive resin layer on a dot-image-bearing transparency having a transparent halftone dot area in a proportion of 1 to 40%, as a support, in intimate contact therewith;
(b) exposing the resulting assembly to actinic light through an image-bearing transparency from the side of the photosensitive resin layer;
(c) exposing the resulting assembly to actinic light from the side of the dot-image-bearing transparency to thereby form on the dot-image-bearing transparency reliefs as an image area and minute points in a non-image area, wherein steps (b) and (c) may be conducted in the order: (b) and then (c); or (c) and then (b); or simultaneously.

* * * * *

UNITED STATES PATENT AND TRADEMARK OFFICE
CERTIFICATE OF CORRECTION

PATENT NO. : 4,101,324
DATED : July 18, 1978
INVENTOR(S) : Masayoshi MIZUNO et al It is certified that error appears in the above-identified patent and that said Letters Patent are hereby corrected as shown below:

IN THE HEADING:

Foreign Application Priority Data:

insert -- Sep. 5, 1975          Japan..............107056 --

*Signed and Sealed this*

*Ninth* Day of *January 1979*

[SEAL]

Attest:

RUTH C. MASON
*Attesting Officer*

DONALD W. BANNER
*Commissioner of Patents and Trademarks*

UNITED STATES PATENT AND TRADEMARK OFFICE
CERTIFICATE OF CORRECTION

PATENT NO. : 4,101,324
DATED : July 18, 1978
INVENTOR(S) : MIZUNO et al.

It is certified that error appears in the above-identified patent and that said Letters Patent are hereby corrected as shown below:

Column 20, line 24 (Claim 1, line 4) change "transparent or" to --at least--.

Column 20, line 25 (Claim 1, line 5) change "at least" to --transparent or--.

Column 20, line 66 (Claim 8, line 4) change "transparent or" to --at least--.

Column 20, line 67 (Claim 8, line 5) change "at least" to --transparent or--.

Signed and Sealed this

Sixth Day of March 1979

[SEAL]

Attest:

RUTH C. MASON
*Attesting Officer*

DONALD W. BANNER
*Commissioner of Patents and Trademarks*